(12) United States Patent
Lin et al.

(10) Patent No.: US 7,554,366 B2
(45) Date of Patent: Jun. 30, 2009

(54) CMOS DRIVING CIRCUIT

(75) Inventors: Chinglong Lin, Shanghai (CN); Jianguo Ding, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/851,329

(22) Filed: Sep. 6, 2007

(65) Prior Publication Data

US 2008/0265949 A1 Oct. 30, 2008

(30) Foreign Application Priority Data

Apr. 24, 2007 (CN) .................... 2007 1 0040244

(51) Int. Cl.
*H03K 3/00* (2006.01)
(52) U.S. Cl. .................... 327/108; 327/65
(58) Field of Classification Search ............ 327/62, 327/63, 65, 108, 109, 112, 407, 408
See application file for complete search history.

(56) References Cited

U.S. PATENT DOCUMENTS 5,528,548 A * 6/1996 Horiguchi et al. .......... 365/226
5,838,171 A * 11/1998 Davis ....................... 327/19
6,288,594 B1 * 9/2001 Manstretta et al. ......... 327/408
6,642,750 B1 * 11/2003 Egan ........................ 327/63
6,653,891 B1 * 11/2003 Hazucha ................... 327/540
6,724,226 B2 * 4/2004 Kim ......................... 327/108
2007/0019348 A1 * 1/2007 Bhattacharya et al. ..... 361/91.1

* cited by examiner

Primary Examiner—Lincoln Donovan
Assistant Examiner—Thomas J Hiltunen
(74) Attorney, Agent, or Firm—Squire, Sanders & Dempsey, L.L.P.

(57) ABSTRACT

A CMOS driving circuit, wherein an output buffer stage with a transistor switch is added to the final buffer stage of a conventional CMOS driving circuit to drive a power transistor. The output buffer stage has two input terminals for DC input voltage, and uses the high voltage of a voltage converting circuit in a multi-voltage system as one DC input voltage. The driving load capacity of the CMOS driving circuit is improved by converting the higher of the two DC input voltages to a modulated driving voltage and outputting it via an output terminal, so that the on-resistance of a power transistor connected with the output buffer stage is lowered, the power consumption of the power transistor is reduced, the output capacity is improved, and the area of the power transistor is lowered with the same output power.

6 Claims, 5 Drawing Sheets

CMOS DRIVING CIRCUIT

This application claims priority of Chinese Patent Application No. 200710040244.2, filed Apr. 24, 2007, the entire disclosure of which is incorporated herein by reference.

FIELD OF THE INVENTION

The present invention relates to a switch driving circuit, in particular, to a CMOS driving circuit.

BACKGROUND OF THE INVENTION

With the rapid development of the semiconductor industry, the application field of various power chips becomes broader and broader. For example, the power chips may be used for the control of AC motors, the driving circuit of a flat panel display, the driving circuit of a printer, a sound power amplifier system, and so on. The driving chips all have driving loads.

Power transistor (MOSFET) has advantages of low on-resistance and high load current, and is highly suitable for functioning as the rectifying component of an SMPS (Switch-Mode Power Supply). The most important characteristic of a power MOSFET is that, the greater the on-resistance Ron is, the higher the output power of the power MOSFET will be. With the idea condition, the on-resistance Ron may be zero. In practical, the on-resistance of a power MOSFET is represented by the following formula:

$$Ron = \frac{1}{\mu C_{OX} \frac{W}{L}(V_{GS} - V_T)}$$

Wherein, $\mu$ is carrier mobility, $C_{OX}$ is gate capacitance of the power MOSFET per unit-area; W/L is aspect ratio of the power MOSFET; $(V_{GS}-V_T)$ is over driving voltage, wherein $V_{GS}$ is the modulated driving voltage applied to the gate of the power MOSFET; $V_T$ is the threshold voltage of the power MOSFET. It can be seen from the above formula that: the greater W/L is, the greater $(V_{GS}-V_T)$ will be, and the smaller Ron will be. In the prior art, the output power of the power MOSFET is usually improved by increasing the aspect ratio W/L of the power MOSFET, i.e., by increasing the area of the power MOSFET. However, when the area is increased, the cost of an integrated circuit will be increased. It can also be seen from the above formula that the Ron of the power MOSFET is also related to the over driving voltage $(V_{GS}-V_T)$; the greater the over driving voltage $(V_{GS}-V_T)$ is, the smaller the Ron will be, that is, the greater the output power of the power MOSFET will be. The modulated driving voltage $V_{GS}$ input to the power MOSFET is usually obtained by a driving circuit.

At present, a CMOS driving circuit with at least one buffer stage is usually used to drive the power MOSFET. Each buffer stage of the CMOS driving circuit has a PMOS transistor and an NMOS transistor between the power supply and the ground. In the CMOS, with a control signal, the NMOS transistor may be in off-state (on-state) when the PMOS transistor is in on-state (off-state). When the PMOS transistor is in on-state and the NMOS transistor is in off-state, the output terminal is shorted with the power supply, and a high voltage is output. However, when the PMOS transistor is in off-state and the NMOS transistor is in on-state, the output terminal is shorted with the ground, and a low voltage is output.

Figure 1:
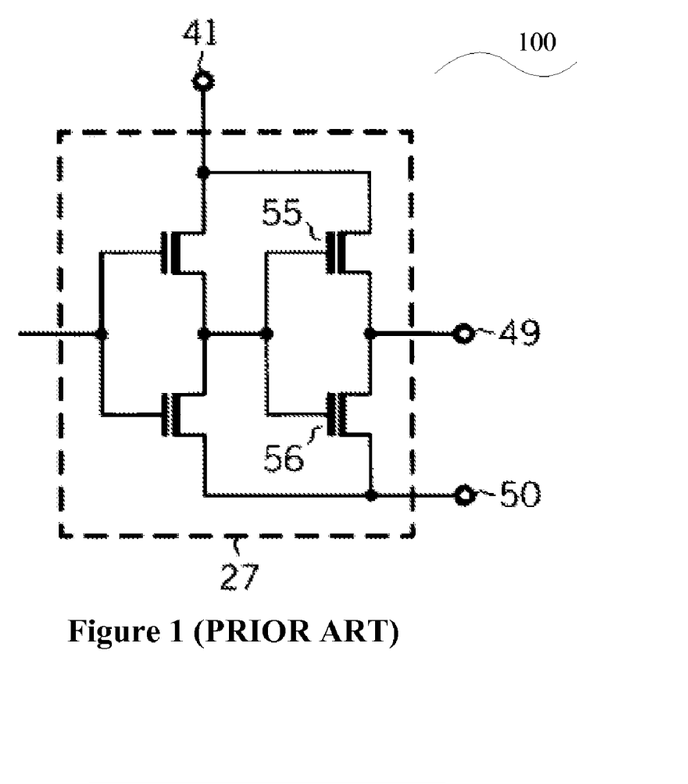
FIG. 1 shows a CMOS driving circuit with a two-stage buffer stage of the prior art.

U.S. Pat. No. 7,126,388 discloses a CMOS driving circuit. FIG. 1 shows a two-stage buffer stage 27 in CMOS driving circuit 100 of the prior art. The CMOS driving circuit disclosed in this patent includes multistage buffer stages. The source of PMOS transistor 55 at each buffer stage is connected with DC voltage input terminal 41, and the drain of PMOS transistor 55 at each buffer stage is connected with the drain of NMOS transistor 56 and is led out as output terminal 49 of the buffer stage. The source of NMOS transistor 56 is connected to terminal 50 which is usually grounded. The gate of PMOS transistor 55 is connected with the gate of NMOS transistor 56 and is connected with the output terminal of last buffer stage. A timing signal generated by a clock is input to the gate of the NMOS transistor and the gate of the PMOS transistor at the first buffer stage. The output terminal of the final buffer stage is connected with the gate of the power transistor. The area of the PMOS transistor and the NMOS transistor at each buffer stage is larger than the area of the transistors of last buffer stage, so that a larger driving current may be obtained.

However, when a power transistor is driven with the above CMOS driving circuit, the modulated driving voltage is output as a single voltage. If this voltage is a low voltage, the output power of the power transistor will be small. To increase the output power of the power transistor, the area of the power transistor may be increased, thus the cost is increased. In multi-voltage systems, for example, in a voltage converting circuit, the CMOS driving circuit of the prior art cannot flexibly use the high-voltage driving capacity.

SUMMARY OF THE INVENTION

An embodiment of the present invention provides a CMOS driving circuit, which use a high voltage of a voltage converting circuit in a multi-voltage system as one of the DC input voltages, and convert the higher of the two DC input voltages to a modulated driving voltage and outputting it via an output terminal, thus the driving load capacity of the CMOS driving circuit is improved.

An embodiment of the present invention provides a CMOS driving circuit, including:

a first DC input terminal adapted to input a first DC input voltage;

a second DC input terminal adapted to input a second DC input voltage;

a first multistage buffer stage adapted to amplify an output current stage by stage, connected with the first DC input terminal and including at least one buffer stage;

a second multistage buffer stage adapted to amplify the output current stage by stage, connected with the second DC input terminal and including at least one buffer stage; and an output buffer stage adapted to convert the larger of the first and second DC input voltages to a modulated driving voltage output according to a comparison result of the first and the second DC input voltages and a timing signal output by a final stage of the multistage buffer stage.

The output buffer stage includes:

a comparator adapted to compare the first DC input voltage with the second DC input voltage;

a first converting circuit, adapted to convert the first DC input voltage to a modulated driving voltage according to the timing signal output by the final stage of the first multistage buffer stage and output the modulated driving voltage via an output terminal of the CMOS driving circuit when the first DC input voltage is higher than the second DC input voltage; and a second converting circuit, adapted to convert the second DC input voltage to a modulated driving voltage according to the timing signal output by the final stage of the second multistage buffer stage and outputs the modulated driving voltage via an output terminal of the CMOS driving circuit when the second DC input voltage is higher than the first DC input voltage.

The first converting circuit includes:

a first PMOS transistor, whose bulk electrode is connected with the first DC input terminal;

a first transistor switch, which includes PMOS transistor and is connected with the first PMOS transistor to form a back-to-back diode with two terminals, one terminal is connected with the first DC input terminal and the other functions as an output terminal of the CMOS driving circuit, and the bulk electrode of the first transistor switch is connected with the second DC input terminal or the output terminal of the CMOS driving circuit; and a first NMOS transistor, whose drain is connected with the output terminal and whose bulk electrode is connected with the source and grounded.

The second converting circuit includes:

a second PMOS transistor, whose bulk electrode is connected with the second DC input terminal;

a second transistor switch, which includes PMOS transistor and is connected with the second PMOS transistor to form a back-to-back diode with two terminals, one terminal is connected with the second DC input terminal and the other functions as an output terminal of the CMOS driving circuit, and the bulk electrode of the second transistor switch is connected with the first DC input terminal or the output terminal of the CMOS driving circuit; and a second NMOS transistor, whose drain is connected with the output terminal and whose bulk electrode is connected with source and grounded;

when the first DC input voltage is higher than the second DC input voltage, a comparison signal output from the comparator is input to the first transistor switch of the first converting circuit, so that the first transistor switch is turned on and the second transistor switch of the second converting circuit is turned off, and a first timing signal output from the final stage of the first multistage buffer stage is input to the gates of the first PMOS transistor and the first NMOS transistor, the second DC input voltage is input to the gate of the second PMOS transistor, and the gate of the second NMOS transistor is grounded;

when the second DC input voltage is higher than the first DC input voltage, a comparison signal output from the comparator is input to the first transistor switch of the first converting circuit, so that the first transistor switch turns off and the second transistor switch of the second converting circuit turns on, and a second timing signal output from the final stage of the second multistage buffer stage is input to the gates of the second PMOS transistor and the second NMOS transistor, the first DC input voltage is input to the gate of the first PMOS transistor, and the gate of the first NMOS transistor is grounded.

The output buffer stage further includes a first detection circuit and a second detection circuit, to which the first and second DC input voltages are input respectively to generate a first voltage and a second voltage.

The first voltage and the second voltage are input to the input terminal of the comparator, and the output terminal of the comparator is connected with the gate of the first transistor switch and an input terminal of an inverter, and an output terminal of the inverter is connected with the gate of the second transistor switch.

The output terminal of the CMOS driving circuit is connected with the power transistor.

In an embodiment of the present invention, an output buffer stage with a transistor switch is added to the final buffer stage of a CMOS driving circuit of the prior art to drive a power transistor. The output buffer stage has two input terminals for inputting DC voltage, and the higher voltage of a voltage converting circuit in a multi-voltage system is used as one DC input voltage. Hence, the on-resistance of a power transistor connected with the output buffer stage is lowered, the power consumption of the power transistor is reduced, the output capacity is improved, and the area of the power transistor is lowered with the same output power.

DETAILED DESCRIPTION OF THE EMBODIMENTS

An embodiment of the present invention provides a CMOS driving circuit, in which an output buffer stage with a transistor switch for driving a power transistor is added to the final buffer stage of a conventional CMOS driving circuit. The output buffer stage has two input terminals for DC input voltage. The driving load capacity of the CMOS driving circuit is improved by converting the higher of the two DC input voltages to a modulated driving voltage and outputting it via an output terminal, so that the on-resistance of a power transistor connected with the output buffer stage may be lowered, the power consumption of the power transistor may be reduced, the output capacity may be improved, and the area of the power transistor may be lowered with the same output power.

First of all, an embodiment of the present invention provides a CMOS driving circuit, including: a first DC input terminal, adapted to input a first DC input voltage; a second DC input terminal, adapted to input a second DC input voltage; a first multistage buffer stage, which is connected with the first DC input terminal and includes at least one buffer stage for amplifying the output current stage by stage; a second multistage buffer stage, which is connected with the second DC input terminal and includes at least one buffer stage for amplifying the output current stage by stage; and an output buffer stage, which converts the larger of the first and second DC input voltages to a modulated driving voltage output according to the comparison result of the first and second DC input voltages and the timing signal output by the final stage of the multistage buffer stage.

Figure 2:
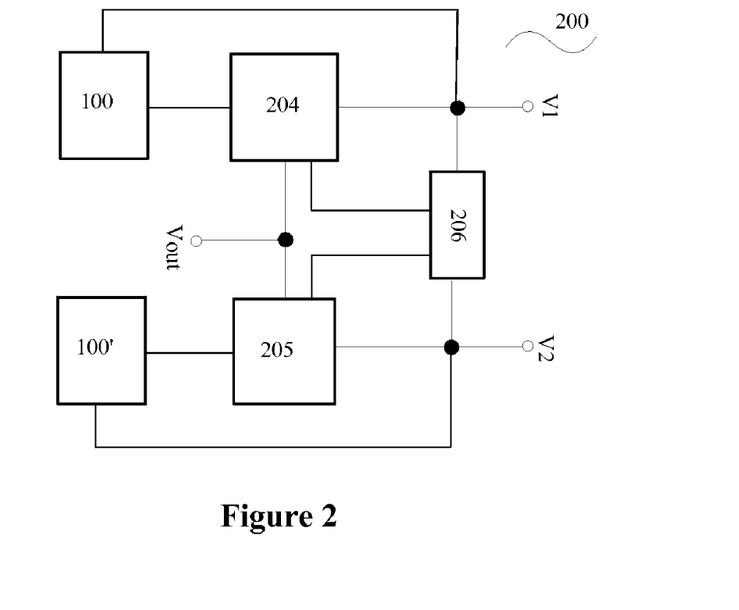
FIG. 2 is a block diagram of a CMOS driving circuit according to an embodiment of the present invention.

FIG. 2 is a block diagram of CMOS driving circuit 200 according to an embodiment of the present invention. The CMOS driving circuit 200 includes: a first DC input terminal, adapted to input the first DC input voltage V1; a second DC input terminal, adapted to input the first DC input voltage V2.

Optionally, the first DC input voltage V1 may be generated by a battery and the second DC input voltage V2 may be generated by a DC-DC converter.

The CMOS driving circuit 200 further includes: a first multistage buffer stage 100 adapted to amplify the output current stage by stage, which is connected with the first DC input terminal and includes at least one buffer stage; and a second multistage buffer stage 100' adapted to amplify the output current stage by stage, which is connected with the second DC input terminal and includes at least one buffer stage. The first multistage buffer stage 100 and the second multistage buffer stage 100' may be the conventional CMOS driving circuit shown in FIG. 1. The first multistage buffer stage 100 and second multistage buffer stage 100' may be same or not.

The CMOS driving circuit 200 further includes an output buffer stage, and the output buffer stage further includes:

a comparator 206, adapted to compare the first DC input voltage V1 with the second DC input voltage V2, the comparison signal of the comparator being input to the first converting circuit 204 and the second converting circuit 205 respectively;

a first converting circuit 204, connected with the final output terminal of the first multistage buffer stage 100, adapted to convert the first DC input voltage V1 to a modulated driving voltage and outputs it via the output terminal of the CMOS driving circuit 200 when the first DC input voltage V1 is higher than the second DC input voltage V2; and a second converting circuit 205, connected with the final output terminal of the second multistage buffer stage 100', adapted to convert the second DC input voltage V2 to a modulated driving voltage and outputs it via the output terminal of the CMOS driving circuit 200 when the second DC input voltage V2 is higher than the first DC input voltage V1.

Figure 3A:
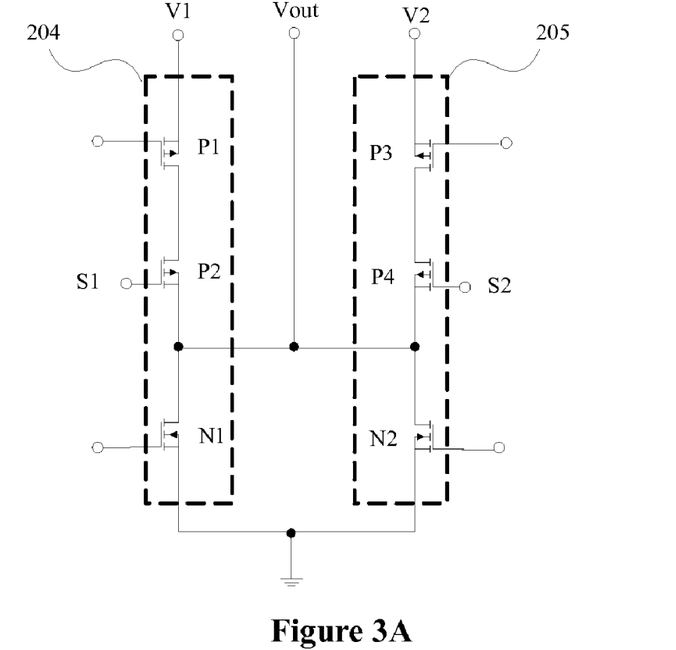
FIGS. 3A-3D show the first converting circuit and the second converting circuit according to an embodiment of the present invention.

FIGS. 3A-3D show a first converting circuit 204 and a second converting circuit 205 according to an embodiment of the present invention. Referring to FIG. 3A, the first converting circuit 204 includes:

a first PMOS transistor P1, whose bulk electrode is connected with the first DC input terminal;

a first transistor switch P2, whose bulk electrode is connected with the output terminal of the CMOS driving circuit and which includes PMOS transistor and is connected with the first PMOS transistor P1 to form a back-to-back diode, wherein two terminals of the back-to-back diode are led out, one is connected with the first DC input terminal and the other functions as the output terminal of the CMOS driving circuit; and a first NMOS transistor N1, whose drain is connected with the output terminal of the CMOS driving circuit and whose bulk electrode is connected with source and is grounded.

The second converting circuit includes:

a second PMOS transistor P3, whose bulk electrode is connected with the second DC input terminal;

a second transistor switch P4, whose bulk electrode is connected with the output terminal of the CMOS driving circuit and which includes PMOS transistor and is connected with the second PMOS transistor P3 to form a back-to-back diode, wherein two terminals of the back-to-back diode are led out, one is connected with the second DC input terminal and the other functions as the output terminal of the CMOS driving circuit; and a second NMOS transistor N2, whose drain is connected with the output terminal of the CMOS driving circuit and whose bulk electrode is connected with source and is grounded.

When the first DC input voltage V1 is higher than the second DC input voltage V2, the comparison signal S1 output from the comparator 206 of the first converting circuit 204 is input to the first transistor switch P2, so that the first transistor switch P2 turns on and the second transistor switch P4 of second converting circuit 205 turns off, and the first timing signal output from the final stage of the first multistage buffer stage 100 is input to the gates of the first PMOS transistor P1 and the first NMOS transistor N1, and the second DC input voltage V2 is input to the gate of the second PMOS transistor and the gate of the second NMOS transistor is grounded.

When the second DC input voltage V2 is higher than the first DC input voltage V1, a comparison signal S2 output from the comparator 206 is input to the first transistor switch P2 of the first converting circuit 204, so that the first transistor switch P2 is turned on and the second transistor switch P4 of the second converting circuit 205 is turned off, and a second timing signal output from the final stage of the second multistage buffer stage 100' is input to the gates of the second PMOS transistor P3 and the second NMOS transistor N2, and the first DC input voltage V1 is input to the gate of the first PMOS transistor P1 and the gate of the first NMOS transistor is grounded.

In this embodiment, the area of the first PMOS transistor P1 and the first NMOS transistor N1 is 3-20 times that of the PMOS transistor and the NMOS transistor at the final stage of the first multistage buffer stage 100. The area of the second PMOS transistor P3 and the second NMOS transistor N2 is 3-20 times that of the PMOS transistor and the NMOS transistor at the final stage of the second multistage buffer stage 100'.

Figure 3B:
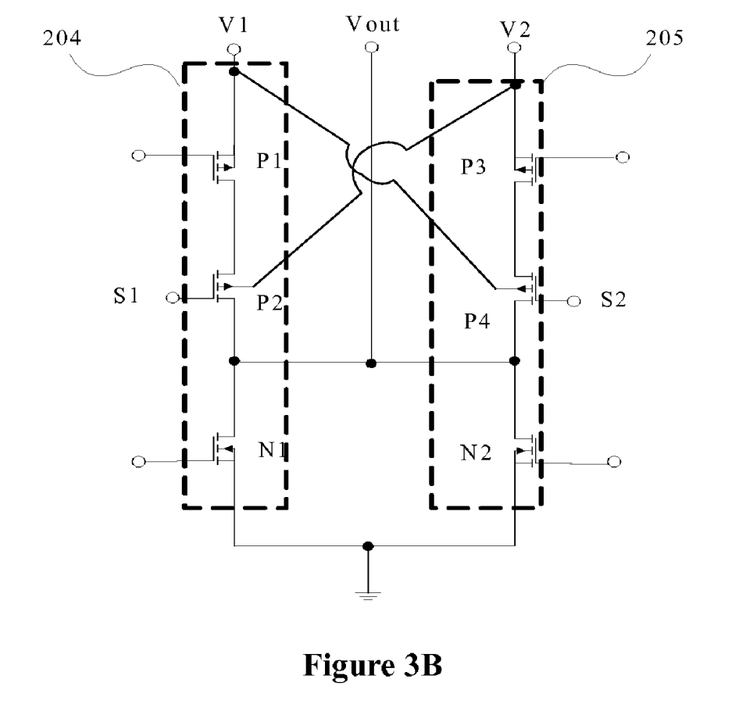
Figure 3C:
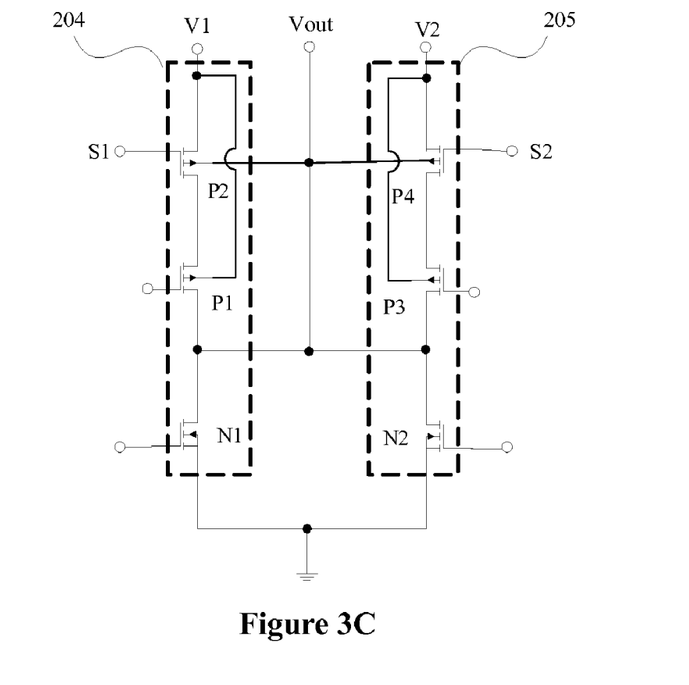
Figure 3D:
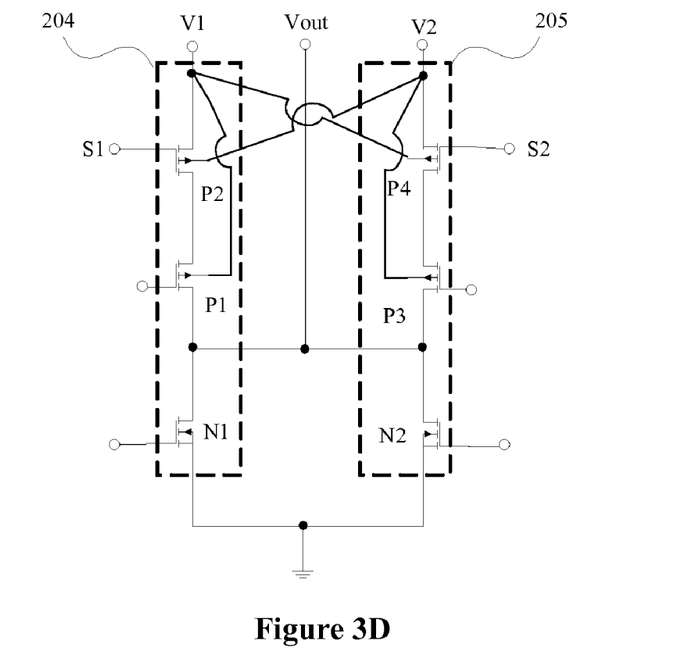

In this embodiment, there are various ways for connecting the first PMOS transistor P1 and the first transistor switch P2 to form a back-to-back diode and for connecting the second PMOS transistor P3 and the second transistor switch P4 to form a back-to-back diode. Referring to FIG. 3B, the difference from FIG. 3A lies in that the bulk electrode of the first transistor switch P2 is connected with the second DC input terminal and the bulk electrode of the second transistor switch P4 is connected with the first DC input terminal. Referring to FIG. 3C, the positions of the first PMOS transistor P1 and the first transistor switch P2 are inverted, the positions of the second PMOS transistor P3 and the second transistor switch P4 are inverted, the bulk electrode of the first PMOS transistor P1 is connected with the first DC input terminal, the bulk electrode of the first transistor switch P2 is connected with the output terminal of the CMOS driving circuit, the bulk electrode of the second PMOS transistor P3 is connected with the second DC input terminal, and the bulk electrode of the second transistor switch P4 is connected with the output terminal of the CMOS driving circuit. Referring to FIG. 3D, the difference from FIG. 3C lies in that the bulk electrode of the first transistor switch P2 is connected with the first DC input terminal and the bulk electrode of the second transistor switch P4 is connected with the second DC input terminal.

In addition, the first PMOS transistor P1 and the first transistor switch P2, the second PMOS transistor P3 and the second transistor switch P4, may also be connected in other ways. For example, the positions of the first PMOS transistor P1 and the first transistor switch P2 in the first converting circuit 204 may be inverted, such as the first converting circuit 204 shown in FIG. 3C and FIG. 3D, while the positions of the second PMOS transistor P3 and the second transistor switch P4 in the second converting circuit 205 will not be inverted, such as the second converting circuit 205 shown in FIG. 3A and FIG. 3B. In the above modification, the following conditions may be satisfied: the bulk electrode of the first PMOS transistor P1 in the first converting circuit 204 is connected with the first DC input terminal, the bulk electrode of the first transistor switch P2 is connected with the output terminal or the second DC input terminal of the CMOS driving circuit 200; the bulk electrode of the second PMOS transistor P3 in the second converting circuit 205 is connected with the first DC input terminal, the bulk electrode of the second transistor switch P4 is connected with the output terminal or the second DC input terminal of the CMOS driving circuit 200. Herein, the scope of the present invention will not be too much limited.

Figure 4:
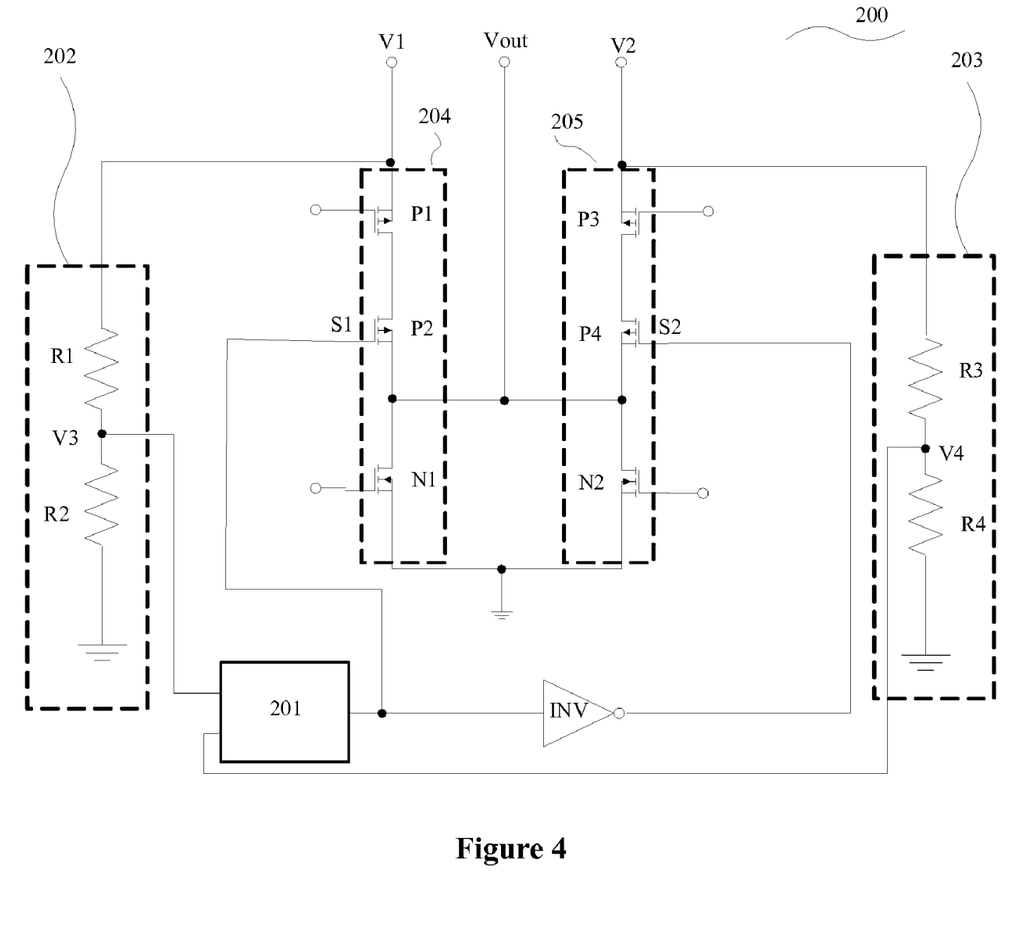
FIG. 4 shows an output buffer stage circuit according to an embodiment of the present invention.

FIG. 4 shows a structure of an output buffer stage according to an embodiment of the present invention. The first converting circuit 204 and the second converting circuit 205 of the output buffer stage are connected as shown in FIG. 3A, and repeated explanations thereof will be omitted.

The output buffer stage further includes a first detection circuit 202 adapted to generate the first voltage V3. The first detection circuit 202 is connected with the first DC input terminal and includes a first resistor R1 and a second resistor R2 connected in series. A terminal of the second resistor R2 is grounded. A first voltage V3 is generated via the voltage division of the second resistor R2.

The output buffer stage further includes a second detection circuit 203 adapted to generate the second voltage V4. The second detection circuit 203 is connected with the second DC input terminal and includes a third resistor R3 and a fourth resistor R4 connected in series. A terminal of the fourth resistor R4 is grounded. A second voltage V4 is generated via the voltage division of the fourth resistor R4.

The voltage division coefficient of the second resistor R2 and the fourth resistor R4 are same; that is, R2/(R1+R2) is equal to R4/(R3+R4). Correspondingly, V3/V1 is equal to V4/V2.

The first voltage V3 and the second voltage V4 are input to the input terminal of the comparator 206 of the output buffer stage. The output terminal is connected with the gate of the first transistor switch P2 and the input terminal of the inverter INV, and the output terminal of the inverter INV is connected with the gate of the second transistor switch P4.

The output terminal of the output buffer stage is connected with the power transistor.

Then, referring to FIG. 4, the operation of the output buffer stage 200 of the present invention will be described.

The first DC input voltage V1 and the second DC input voltage V2 are input to the first and second DC input terminals of the output buffer stage respectively.

The first detection circuit 202 and the second detection circuit 203 generate a first voltage V3 and a second voltage V4 respectively, and input them to the two input terminals of the comparator 206.

When the first voltage V3 is higher than the second voltage V4, i.e., when the first DC input voltage V1 is higher than the second DC input voltage V2, the comparison signal S1 output from the comparator 206 is a zero voltage signal and is input to the gate of the first transistor switch P2 of the first converting circuit 204, then the first transistor switch P2 turns on. Meanwhile, the comparison signal passes through an inverter INV, and the reversed comparison signal is input to the gate of the second transistor switch P4 of the second converting circuit 205, then the second transistor switch P4 turns off, and the second converting circuit 205 is shut off. At the same time, in order to disable the second converting circuit, the second DC input voltage is input to the gate of the second PMOS transistor P3 in the second converting circuit 205, and the gate of the second NMOS transistor N2 is grounded.

The first timing signal input to the gates of the first PMOS transistor P1 and the first NMOS transistor N1 is generated by the first multistage buffer stage 100 (not shown). When the first timing signal is a low voltage signal, the first PMOS transistor P1 of the first converting circuit 204 turns on and the first NMOS transistor N1 turns off; and the output voltage Vout of the output terminal will be the first DC input voltage V1.

When the first timing signal input to the gates of the first PMOS transistor P1 and the first NMOS transistor N1 is a high voltage signal, the first PMOS transistor P1 of the first converting circuit 204 turns off and the first NMOS transistor N1 turns on; and the output voltage Vout from the output terminal will be the zero voltage signal.

With the changing of the timing signal, the low voltage of the output voltage Vout from the output terminal becomes zero, and the high voltage of the output voltage Vout becomes the modulated driving voltage V1.

When the first voltage V3 is lower than the second voltage V4, i.e., when the first DC input voltage V1 is less than the second DC input voltage V2, the comparison signal output from the comparator 206 will be a high voltage signal, that is, the comparison signal S1 input to the gates of the first transistor switch P2 of the first converting circuit 204 is a high voltage signal, and the first transistor switch P2 turns off and the first converting circuit 204 is shut off. The comparison signal passes through the inverter INV, and the comparison signal S1 changes to a zero voltage signal S2, and then is input to the gate of the second transistor switch P4 of the second converting circuit 205, hence, the transistor switch P4 turns on. In order to disable the first converting circuit, the first DC input voltage is input to the gate of the first PMOS transistor P1 and the gate of first NMOS transistor N1 is grounded.

The second timing signal input to the gates of the second PMOS transistor P3 and the second NMOS transistor N2 is generated by the second multistage buffer stage 100' (not shown). When the second timing signal is a low voltage signal, the second PMOS transistor P3 of the second converting circuit 205 turns on and the second NMOS transistor N2 turns off; and the output voltage Vout of the output terminal will be the second DC input voltage V2.

When the second timing signal input to the gates of the second PMOS transistor P3 and the second NMOS transistor N2 is a high voltage signal, the second PMOS transistor P3 of the second converting circuit 205 turns off and the second NMOS transistor N2 turns on; and the output voltage Vout from the output terminal will be the zero voltage signal.

With the changing of the timing signal, the low voltage of the output voltage Vout from the output terminal becomes zero, and the high voltage of the output voltage Vout becomes the modulated driving voltage V2.

Figure 5:
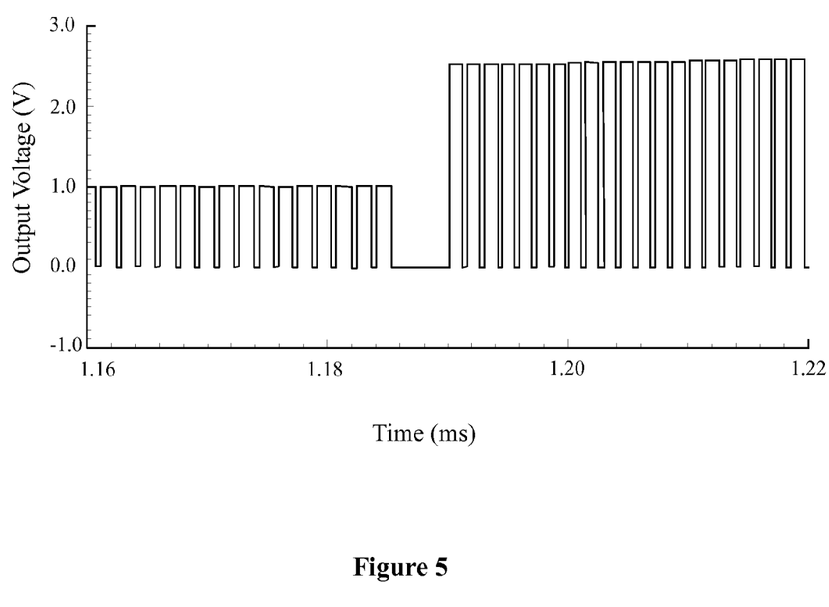
FIG. 5 shows a modulated driving voltage output by a CMOS driving circuit according to an embodiment of the present invention.

FIG. 5 shows the output result of the CMOS driving circuit according to an embodiment of the present invention. The first DC input voltage V1 input to the first DC input terminal is a battery voltage of 1.0V. The second DC input voltage V2 input to the second DC input terminal is the output voltage of a DC-DC converter. When the output voltage from the DC-DC converter, i.e., the second DC input voltage V2, is lower than the first DC input voltage V1, which corresponds to the period before 1.186 ms in FIG. 5, the high voltage of the output voltage Vout from the output terminal of the output buffer stage is V1, and the low voltage is the modulated driving voltage of 0 V. When the output voltage of the DC-DC converter, i.e., the second DC input voltage V2 (2.5V), is higher than the first DC input voltage V1, which corresponds to the period after 1.19 ms in FIG. 5, the high voltage of the output voltage Vout from the output terminal of the output buffer stage is V2, and the low voltage is the modulated driving voltage of 0 V.

In the CMOS driving circuit according to the embodiments of the present invention, an output buffer stage with a transistor switch is added to the final buffer stage of a conventional CMOS driving circuit to drive a power transistor. The output buffer stage has two input terminals for DC input voltage, and the high voltage of the voltage converting circuit in the multi-voltage system is used as one DC input voltage. The driving load capacity of the CMOS driving circuit is improved by converting the higher of the two DC input voltages to a modulated driving voltage and outputting it via an output terminal, so that the on-resistance of a power transistor connected with the output buffer stage may be lowered, the power consumption of the power transistor may be reduced, the output capacity may be improved, and the area of the power transistor may be lowered with the same output power.

While the present invention has been illustrated and described with reference to some preferred embodiments, the present invention is not limited to these. Those skilled in the art should recognize that various variations and modifications can be made without departing from the spirit and scope of the present invention as defined by the accompanying claims.

The invention claimed is:

1. A CMOS driving circuit, comprising:
a first DC input terminal adapted to input a first DC input voltage;
a second DC input terminal adapted to input a second DC input voltage;
a first multistage buffer stage adapted to amplify an output current stage by stage, connected with the first DC input terminal and including at least one buffer stage;
a second multistage buffer stage adapted to amplify the output current stage by stage, connected with the second DC input terminal and including at least one buffer stage;
a comparator adapted to compare the first DC input voltage with the second DC input voltage;
a first converting circuit comprising:
a first PMOS transistor, whose bulk electrode is connected with the first DC input terminal,
a first transistor switch, which comprises a PMOS transistor and is connected with the first PMOS transistor to form a back-to-back diode with two terminals, one terminal is connected with the first DC input terminal and the other functions as an output terminal of the CMOS driving circuit, and the bulk electrode of the first transistor switch is connected with the second DC input terminal or the output terminal of the CMOS driving circuit, and
a first NMOS transistor, whose drain is connected with the output terminal and whose bulk electrode is connected with the source and grounded; and
a second converting circuit comprising:
a second PMOS transistor, whose bulk electrode is connected with the second DC input terminal,
a second transistor switch, which comprises a PMOS transistor and is connected with the second PMOS transistor to form a back-to-back diode with two terminals, one terminal is connected with the second DC input terminal and the other functions as an output terminal of the CMOS driving circuit, and the bulk electrode of the second transistor switch is connected with the first DC input terminal or the output terminal of the CMOS driving circuit, and
a second NMOS transistor, whose drain is connected with the output terminal and whose bulk electrode is connected with source and grounded;
wherein when the first DC input voltage is higher than the second DC input voltage, a comparison signal output from the comparator is input to the first transistor switch of the first converting circuit, so that the first transistor switch turns on and the second transistor switch of the second converting circuit turns off, and a first timing signal output from the final stage of the first multistage buffer stage is input to the gates of the first PMOS transistor and the first NMOS transistor, the second DC input voltage is input to the gate of the second PMOS transistor, and the gate of the second NMOS transistor is grounded; and
wherein when the second DC input voltage is higher than the first DC input voltage, a comparison signal output from the comparator is input to the first transistor switch of the first converting circuit, so that the first transistor switch turns off and the second transistor switch of the second converting circuit turns on, and a second timing signal output from the final stage of the second multistage buffer stage is input to the gates of the second PMOS transistor and the second NMOS transistor, the first DC input voltage is input to the gate of the first PMOS transistor, and the gate of the first NMOS transistor is grounded.

2. The CMOS driving circuit according to claim 1, wherein the output buffer stage further comprises a first detection circuit and a second detection circuit, to which the first and second DC input voltages are input respectively to generate a first voltage and a second voltage.

3. The CMOS driving circuit according to claim 2, wherein the first voltage and the second voltage are input to the input terminal of the comparator, and the output terminal of the comparator is connected with the gate of the first transistor switch and the input terminal of an inverter, and the output terminal of the inverter is connected with the gate of the second transistor switch.

4. The CMOS driving circuit according to claim 1, wherein the output terminal of the CMOS driving circuit is connected with a power transistor.

5. The CMOS driving circuit according to claim 2, wherein the output terminal of the CMOS driving circuit is connected with a power transistor.

6. The CMOS driving circuit according to claim 3, wherein the output terminal of the CMOS driving circuit is connected with a power transistor.

* * * * *